US005328808A

United States Patent [19]

Sakamoto

[11] Patent Number: 5,328,808

[45] **Date of Patent: * Jul. 12, 1994**

[54] METHOD FOR MANUFACTURING EDGE EMISSION TYPE ELECTROLUMINESCENT DEVICE ARRAYS

[75] Inventor: Koichiro Sakamoto, Shizuoka, Japan

[73] Assignee: Tokyo Electric Co., Ltd., Tokyo, Japan

[ * ] Notice: The portion of the term of this patent subsequent to Apr. 21, 2009 has been disclaimed.

[21] Appl. No.: 925,289

[22] Filed: Aug. 6, 1992

Related U.S. Application Data

[63] Continuation of Ser. No. 509,763, Apr. 17, 1990, abandoned.

[30] Foreign Application Priority Data

Apr. 17, 1989 [JP] Japan .................................... 1-97084

[51] Int. Cl.[5] .......................... G03F 7/26; H05B 33/10

[52] U.S. Cl. .................................... 430/313; 430/316; 430/317; 430/318; 430/319; 313/503; 313/505; 313/507; 313/509; 427/66; 427/126.1; 427/157; 428/917; 156/625; 156/656

[58] Field of Search ............... 430/313, 316, 317, 318, 430/319, 322, 323, 325, 327; 427/66, 126.1, 108, 157; 428/917; 313/502, 503, 505, 507, 509; 156/625, 656

[56] References Cited

U.S. PATENT DOCUMENTS 4,135,959 1/1979 Luo et al. .............................. 427/66
4,496,610 1/1985 Cattell et al. .......................... 427/66
4,535,341 8/1985 Kun et al. ........................ 346/107 R
4,734,617 3/1988 Jacobs et al. ......................... 313/506
4,880,475 11/1989 Lindmayer ........................... 427/66
4,880,661 11/1989 Endo et al. .......................... 427/66
5,072,263 12/1991 Watanabe ............................ 357/17
5,106,652 4/1992 Sakamoto ............................. 427/66

FOREIGN PATENT DOCUMENTS 0363201 4/1990 European Pat. Off. .
61-286866 12/1986 Japan .
63-134495 9/1988 Japan .
64-11748 1/1989 Japan .
185846 6/1989 Japan .

*Primary Examiner*—Marion E. McCamish
*Assistant Examiner*—Kathleen Duda
*Attorney, Agent, or Firm*—Oblon, Spivak, McClelland, Maier & Neustadt

[57] ABSTRACT

Disclosed herein is a method for manufacturing edge emission type EL device arrays. A substrate carrying individually formed EL device arrays is coated with a transparent film. The film is etched to form terminals through exposure of the edges of block terminals and to make contact holes reaching an upper electrode layer of the EL devices. The contact holes are then covered with a conductive layer that is etched to form common electrodes conductive to predetermined edge emission type EL devices within each block.

7 Claims, 7 Drawing Sheets

METHOD FOR MANUFACTURING EDGE EMISSION TYPE ELECTROLUMINESCENT DEVICE ARRAYS

This application is a continuation of U.S. application Ser. No. 07/509,763, filed Apr. 17, 1990, now abandoned.

FIELD OF THE INVENTION AND RELATED ART STATEMENT

The present invention relates to a method for manufacturing arrays of edge emission type EL devices positioned side by side on a substrate by use of thin film technology.

In recent years, improvements in electrophotographic printers have been paralleled by the development of diverse light-emitting devices. One of such devices is the electroluminescent (EL) device which, despite its various benefits, has been known for its often insufficient levels of luminous intensity. The disadvantage is now overcome by the development of the so-called edge emission type EL device that has turned out to be about 100 times as intense in emission as conventional EL devices. The edge emission type EL device has an optical waveguide constituted by wrapping a thin film active layer with dielectric layers. A flatly polarized beam of light is emitted from an edge of the active layer. The luminance of the device is high enough to justify growing expectations for its possible use in various applications including the printer head.

An array 1 of edge emission type EL devices whose construction was outlined above will now be described by referring to FIGS. 9 and 10. The construction of a prior art edge emission type EL device 2 is the first to be described in reference to FIG. 10. The EL device 2 has a thin film active layer 3 that contains zinc sulfide and some active elements sandwiched from above and below with dielectric layers 4 and 5, respectively. The layers 4 and 5 are in turn covered from above and below with flat electrodes 6 and 7, respectively.

The edge emission type EL device array 1 is conventionally manufactured as follows. A lower electrode layer, not shown and deposited by thin film technology or other suitable techniques, is patterned by dry etching or like methods. The patterning produces a lower electrode 9 which acts as a common electrode conductive to a plurality of edge emission type EL devices 2. On top of the lower electrode 9, the layers 3 through 5 and an upper electrode layer 10 are patterned by dry etching and then divided. This forms a plurality of edge emission type EL devices 2. The lower electrode 9 and the upper electrode layer 10 are wired in a matrix pattern to a plurality of electrodes, not shown, to constitute the edge emission type EL device array 1.

Constructed as described above, the EL device array 1 is used in diverse applications including a line head of a line printer that operates on the electrophotography principle. In such a printer, the EL device array 1 has its lower electrode 9 and upper electrode layer 10 connected in a matrix pattern to a driving circuit, not shown. This arrangement is intended to cause the edge emission type EL devices 2 to emit light selectively to print desired images.

The edge emission type EL device array 1 as applied above is driven by high voltages. This means that the array is vulnerable to moisture-induced deterioration. A number of solutions to this problem have been proposed. One such solution involves providing the EL device array with a protective film, not shown, against moisture after the matrix wiring has been completed. However, there still occurs contact between the atmosphere and the cut surface of each edge emission type EL device 2 in such production phases as when the lower electrode 9 and the upper electrode layer 10 are wired to terminals in a matrix pattern. On such occasions, the vapor and/or cleaning water contained in the atmosphere will likely induce moisture penetration between layers of the EL devices 2 or under the protective film thereof. As a result, the edge emission type EL device array 1 has been known for its unstable performance and relatively low reliability.

OBJECT AND SUMMARY OF THE INVENTION

It is therefore an object of the present invention to provide a manufacturing method which prevents moisture penetration between layers of the edge emission type EL device or under the protective film thereof during EL device production.

It is another object of the present invention to provide a manufacturing method which minimizes the duration of time in which the cut surface of each edge emission type EL device is exposed to the atmosphere during EL device production.

According to the present invention, a conductive layer is first formed on a substrate. The conductive layer is etched to form block electrodes conductive to a predetermined number of edge emission type EL devices. On the block electrodes, an EL device layer and an upper electrode layer are produced in deposited form. The EL device layer and the upper electrode layer are patterned and divided into a plurality of edge emission type EL devices. The whole substrate including the EL devices thereon is then covered with a transparent protective film. The film is etched to accomplish two things: to form terminals through exposure of block electrode edges, and making contact holes that reach the upper electrode layer of the edge emission type EL devices. A conductive layer is provided to wrap the contact holes, the layer being etched to form common electrodes each conductive to predetermined edge emission type EL devices of each block.

During the process described above, the edge emission type EL devices are covered with the protective film following their division from the EL device layer and the upper electrode layer. This manufacturing method minimizes the duration of time in which the cut surface of each edge emission type EL device comes into contact with the atmosphere. Thus there is a substantially reduced possibility of moisture penetration between layers of the EL devices or under the protective layer thereof during EL device production.

DETAILED DESCRIPTION OF PREFERRED EMBODIMENTS

Figure 1A:
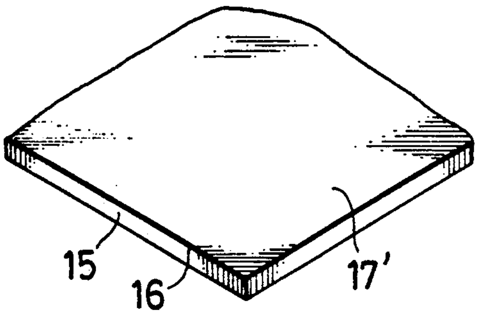
FIGS. 1 (*a*) through 1 (*j*) and FIGS. 2 (*a*) through 2 (*j*) are views of an edge emission type EL device array being manufactured by use of a preferred embodiment of the present invention.
Figure 1D:
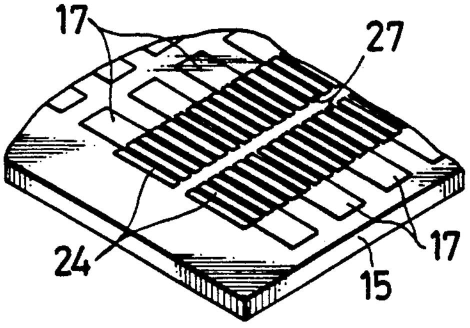
Figure 1B:
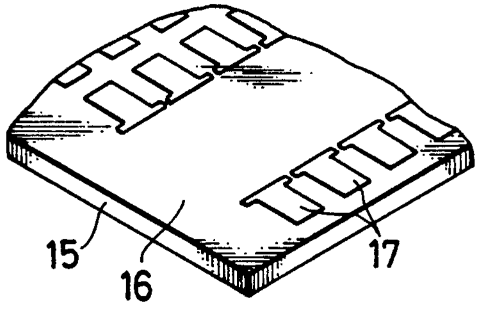
Figure 1E:
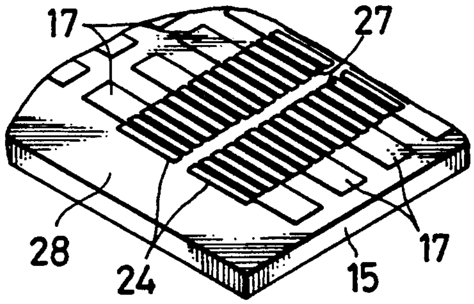
Figure 1C:
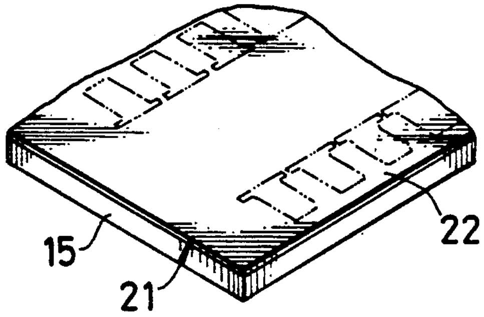
Figure 1F:
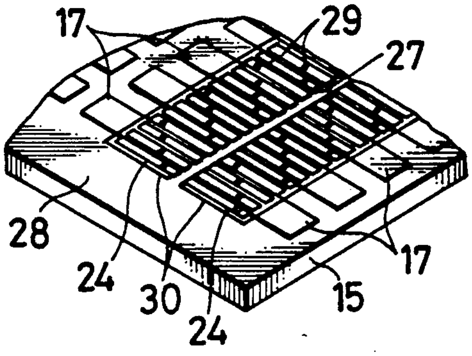
Figure 1G:
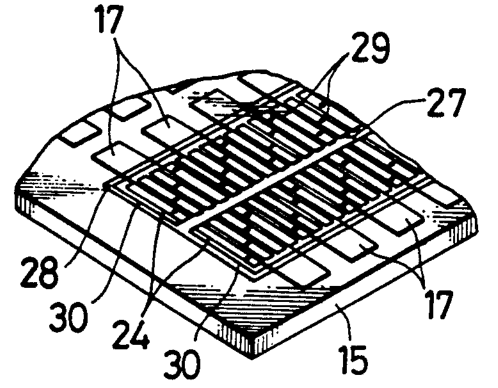
Figure 1I:
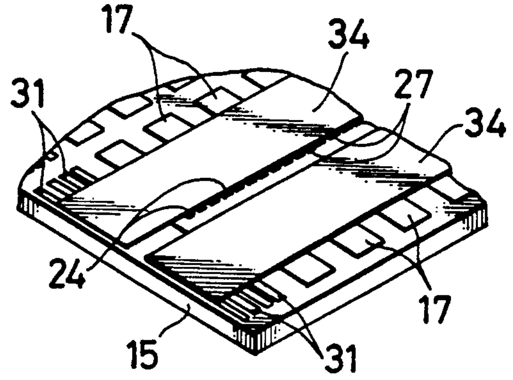
Figure 1H:
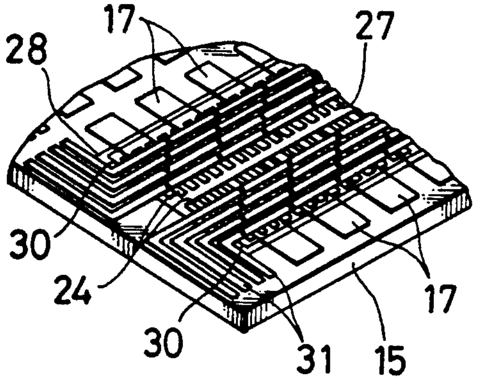
Figure 1J:
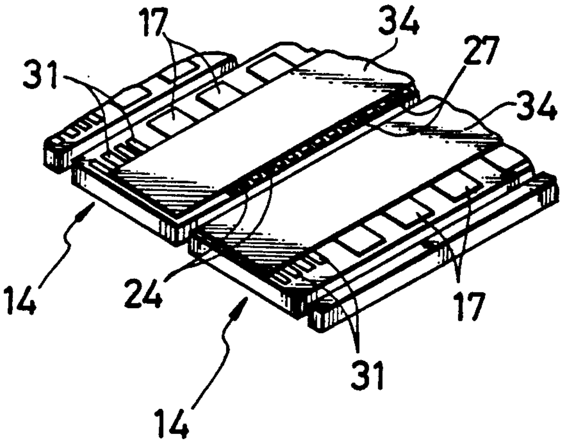
Figures 2A, 2B, 2C, 2D, 2E:
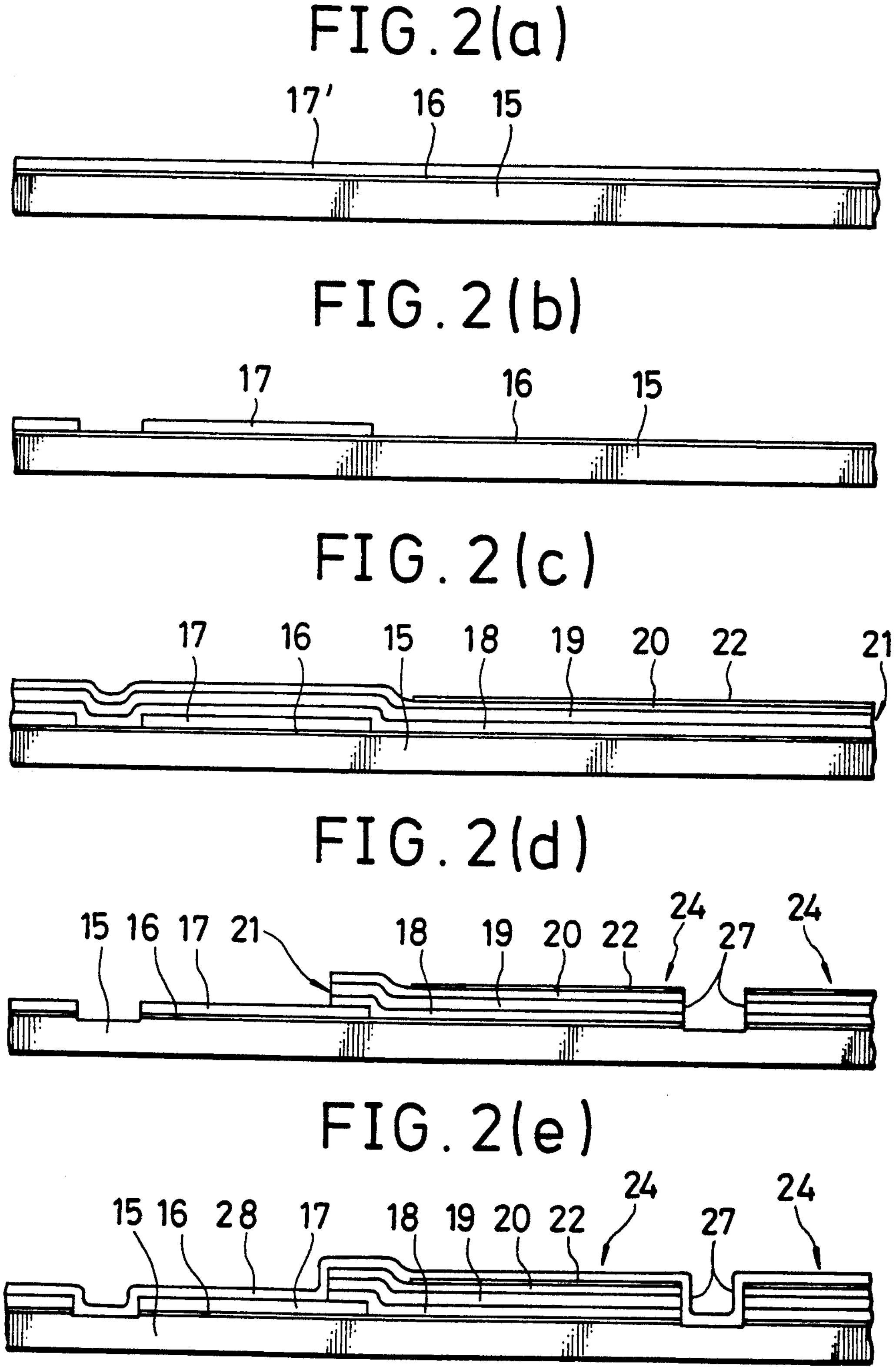
Figure 2F:
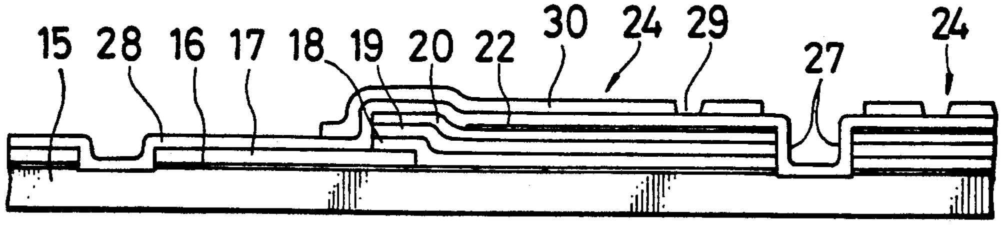
Figure 2G:
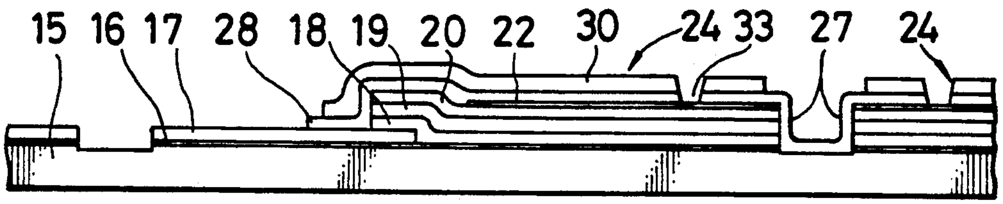
Figure 2H:
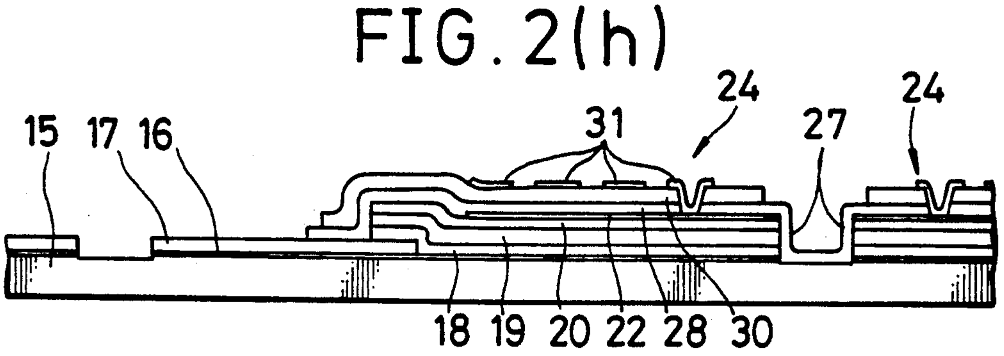
Figure 2I:
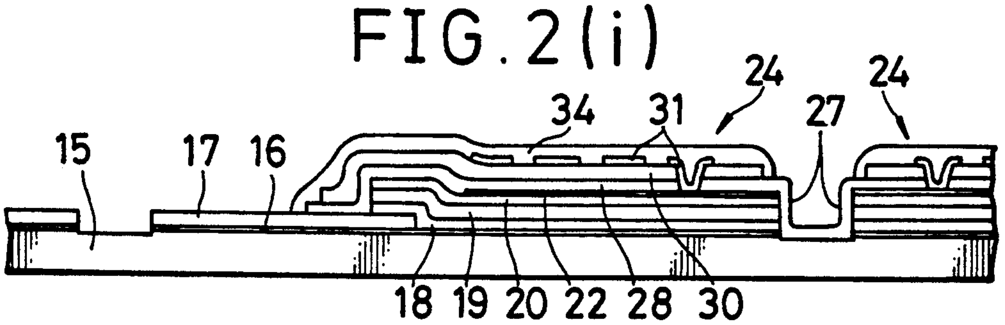
Figure 2J:
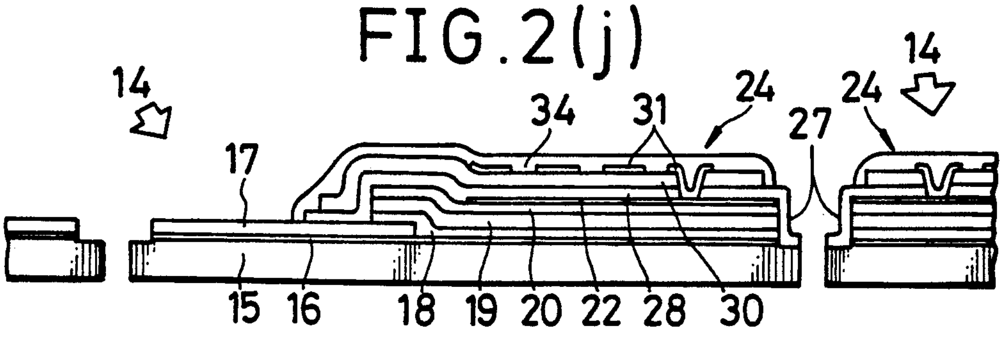

A preferred embodiment of the present invention will now be described by referring to FIGS. 1 through 6. FIGS. 1 (*a*) through 1 (*j*) and FIGS. 2 (*a*) through 2 (*j*) illustrate how an edge emission type EL device array 14 is manufactured by the method embodying the present invention. As shown in FIGS. 1 (*a*) and 2 (*a*), a smooth, previously washed glass substrate 15 is stacked with a first lower electrode layer 16 and a second lower electrode layer 17', the layer 16 being made of Cr and 500 Å thick and the layer 17' constituted by Ti and 5,000 Å thick.

As depicted in FIGS. 1 (*b*) and 2 (*b*), only the second lower electrode layer 17' is photo-etched into a common electrode arrangement that is long in the device array direction, the arrangement being made conductive to a plurality of edge emission type EL devices. As a result of this, block electrodes 17 are produced. At this point, the selective photo-etching is performed easily because the first lower electrode layer 16 is different in material property from the second lower electrode layer 17'.

As illustrated in FIGS. 1 (*c*) and 2 (*c*), a dielectric layer 18, an active layer 19 and another dielectric layer 20 are deposited, in that order, to form an EL device layer 21 which is stacked onto the first lower electrode layer 16 and the block electrodes 17 by use of electron beam evaporation or similar techniques. The dielectric layer 18 is 3,000 Å thick and made up of $Y_2O_3$; the active layer 19 is 10,000 Å thick, doped with Mn and comprised of ZnS; and the dielectric layer 20 is 3,000 Å thick and contains $Y_2O_3$. After a Cr film 1,000 Å thick is provided by sputtering over the EL device layer 21, those portions of the film which correspond to the block electrodes 17 are removed by photo-etching to form an upper electrode layer 22.

Figure 3:
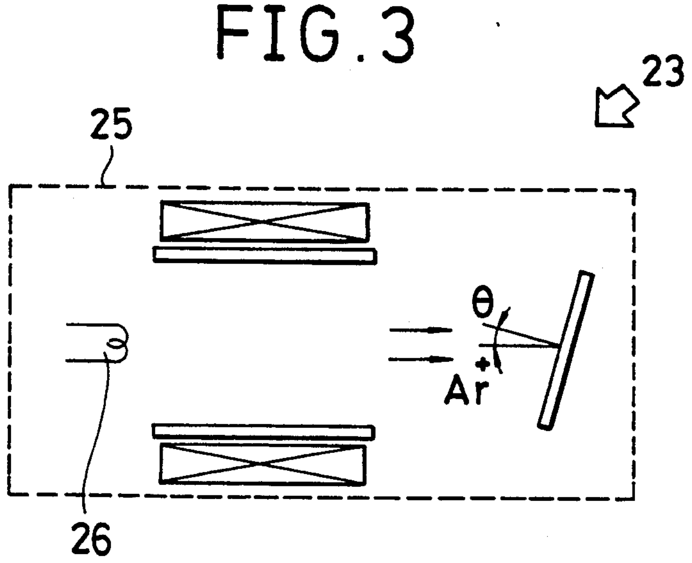
FIG. 3 is a view illustrating how an ion milling machine works in connection with the embodiment.

Then an ion milling machine 23 is used, as shown in FIGS. 1 (*d*) and 2 (*d*), to etch consecutively the layers 18 through 22 and the first lower electrode layer 16 in order to produce a plurality of edge emission type EL devices 24. In this case, the ion milling machine 23 performs etching physically by use of argon ions. Thus unlike dry etching or similar techniques based on reaction gases, the etching operation by this machine etches all deposited films of different properties consecutively. The ion milling machine 23 is a machine that uses a cathode 26 to ionize an argon gas, not shown, introduced into a vacuum chamber 25 and guides argon ions onto a target material for etching, as illustrated in FIG. 3. The target material is positioned at an angle to the incident direction of the argon ions so that the etching surface angle may be adjusted.

Figure 4A:
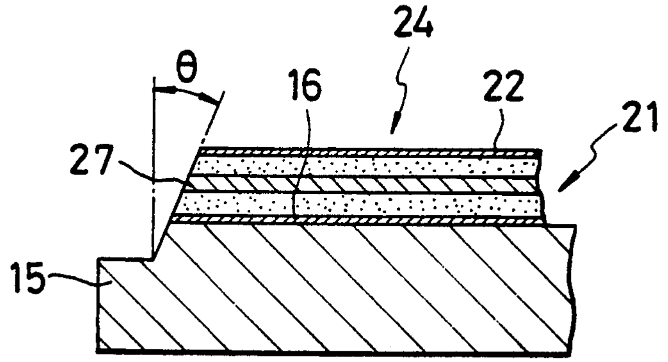
FIGS. 4 (*a*) and 4 (*b*) are cross sections of the edge emission type EL device array manufactured by use of the embodiment.
Figure 4B:
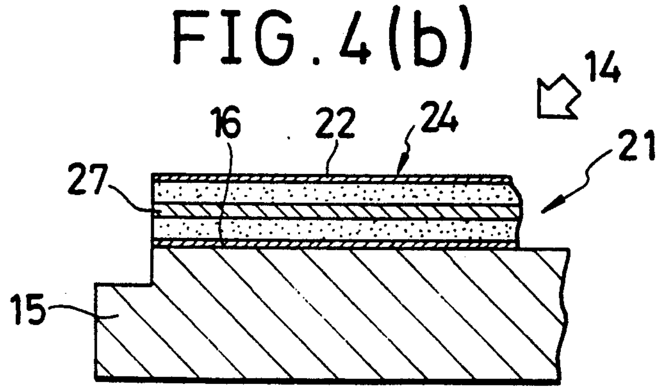
Figure 5:
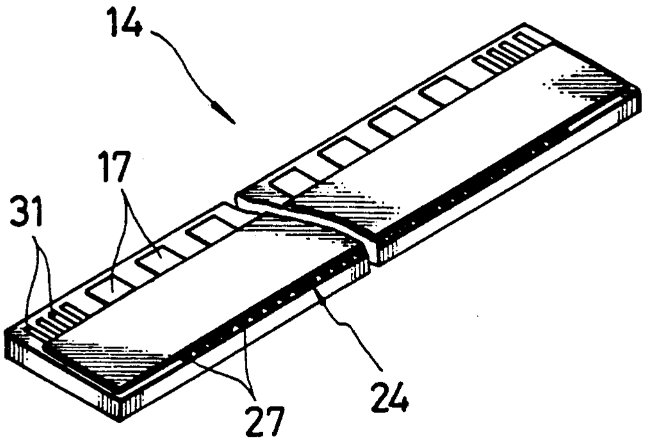
FIG. 5 is a perspective view of the edge emission type EL device array manufactured by use of the embodiment.
Figure 6:
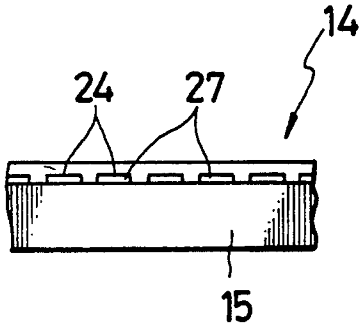
FIG. 6 is a perspective view of the edge emission type EL device array manufactured by use of the embodiment.

When some edge emission type EL devices 24 were manufactured experimentally with the incident angle $\theta$ of the argon ions set for 30°, the shape of a light-emitting edge 27 of each EL device turned out to be unacceptably inclined relative to the light-emitting direction of the device. It was therefore decided to set the argon ion incident angle $\theta$ for 5° for the upper electrode layer 22 through the active layer 19, 10° for the lower dielectric layer 18, and 15° for the first lower electrode 16 and the glass substrate 15 in preparation for etching. The result was a smooth light-emitting surface 27 that was substantially perpendicular to the light-emitting direction, as depicted in FIG. 4 (*b*). In this case, it took more time to etch the second lower electrode layer 17', which was 5,000 Å thick and made of Ti, than the other layers. Thus there was no possibility of having the first and the second electrode layers 17 and 17' divided like the EL device layer 21; the block electrodes 17 were produced easily and reliably.

The top of the edge emission type EL device array 14 produced as described above is entirely covered, by use of the plasma CVD method, with a transparent protective film 28 which is 5,000 Å thick and made of silicon nitride (SiNx), as illustrated in FIGS. 1 (*e*) and 2 (*e*). Because the protective film 28 is formed by the CVD method that is superior to the sputtering or evaporation technique in producing three-dimensional films, both the step coverage of the device array production based on this method and the productivity thereof are high.

The whole protective film 28 is then coated by roll coater or the like with photosensitive polyimide resin, as illustrated in FIGS. 1 (*f*) and 2 (*f*). The light-emitting edges 27 are exposed and pre-holes 29 are produced by photolithography, followed by a heat curing process that forms a polyimide resin film 30. The process of making the polyimide resin film 30 is not indispensable to the manufacture of the edge emission type EL device array 14. But forming the polyimide resin film 30 flattens the gaps between edge emission type EL devices 24, which makes it easier to form common electrodes 31, to be described later, and to reinforce insulation between the electrodes 31 and the upper electrode layer 22. These benefits improve the productivity of the manufacturing process and enhance the characteristics of the products coming out therefrom.

As shown in FIGS. 1 (*g*) and 2 (*g*), the protective film 28 is dry-etched by $CF_4$ gas. This exposes the edges of the block electrodes 17 to form terminals 32 and produces contact holes 33 through the pre-holes 29.

An aluminum-based 1 μm thick dielectric layer, made by sputtering to cover the contact holes 33, is patterned by photo-etching into four common electrodes 31, as depicted in FIGS. 1 (*h*) and 2 (*h*). At this point, the common electrodes 31 conducts to the edge emission type EL devices 24 via the contact holes 33. The common electrodes 31 and the block electrodes 17 together constitute a matrix wiring pattern of the edge emission type EL device array 14.

Epoxy resin or the like is then screen-printed over the whole surface except for the terminals 32 and the light-emitting edges 27 to form a coating film 34, as illustrated in FIGS. 1 (*i*) and 2 (*i*). This film is intended to improve the reliability and durability of the product. Now the substrate 15 has a plurality of edge emission type EL device arrays 14 arranged contiguously thereon.

When the substrate 15 thus formed is divided, numerous edge emission type EL device arrays 14 are acquired at once, as shown in FIGS. 1 (*j*) and 2 (*j*).

Figure 7:
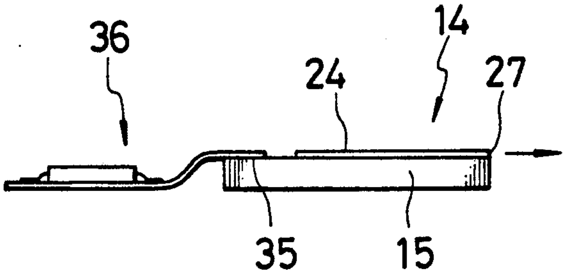
FIG. 7 is a view of the edge emission type EL device array being used in an application.
Figure 8:
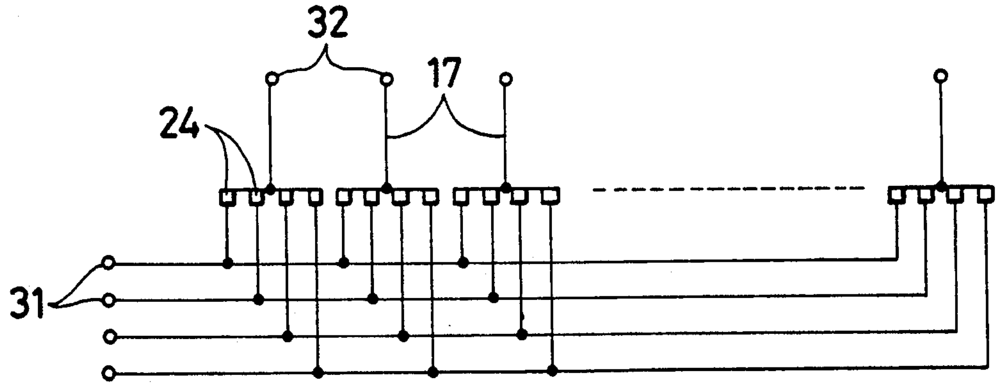
FIG. 8 is a circuit diagram of the edge emission type EL device array.
Figure 9:
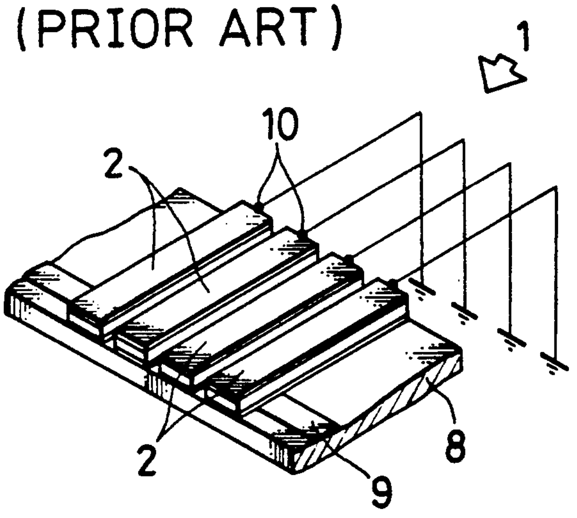
FIG. 9 (PRIOR ART)
Fig. 9 is a perspective view of a prior art edge emission type EL device array.
Figure 10:
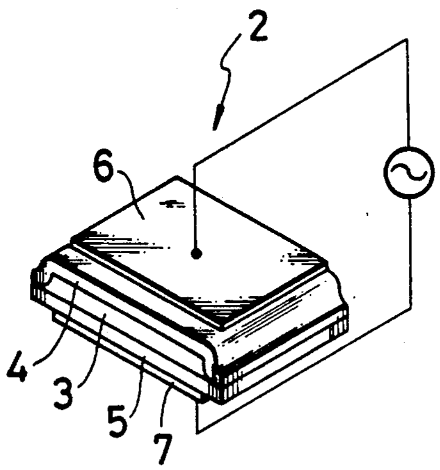
FIG. 10 (PRIOR ART)
FIG. 10 is a perspective view of a prior art edge emission type EL device.

The edge emission type EL device array 14 manufactured in the manner described above may be used in diverse applications such as a small, high-performance line head, not shown. In the example of FIG. 7, the device array 14 is connected to a driving circuit 36 of a line head via an anisotropic conductive film 35.

What is claimed is:

1. A method for manufacturing edge emission type electroluminescent (EL) device arrays, said method comprising the steps of:

forming a conductive layer on a substrate;

etching said conductive layer to produce a plurality of block electrodes each conductive to a predetermined number of edge emission type EL devices;

depositing an EL device layer and an upper electrode layer onto said block electrodes;

patterning said EL device layer and upper electrode layer into a plurality of distinctly divided edge emission type EL devices;

providing a transparent protective film over the entire surface of said substrate containing said edge emission type EL devices;

etching said protective film to form terminals through exposure of the edges of said block electrodes and to make contact holes reaching said upper electrode layer of said edge emission type EL devices;

forming a conductive layer covering said contact holes; and etching said conductive layer to form a plurality of common electrodes conducting to predetermined edge emission type EL devices of each block.

2. A method for manufacturing edge emission type electroluminescent (EL)device arrays, said method comprising the steps of:

forming a conductive layer on a substrate;

etching said conductive layer to produce a plurality of block electrodes each conductive to a predetermined number of edge emission type EL devices;

depositing an EL device layer and an upper electrode layer onto said block electrodes;

patterning said EL device layer and upper electrode layer into a plurality of distinctly divided edge emission type EL devices;

providing a transparent protective film over the entire surface of said substrate containing said edge emission type EL devices;

providing a photosensitive polyimide resin film onto the entire surface of said transparent protective film;

etching said polyimide resin film to expose light-emitting edges of said edge emission type EL devices and to make pre-holes reaching said transparent protective film;

thermally curing said polyimide resin film to produce an insulating layer;

etching said protective film through the pre-holes to form terminals through exposure of the edges of said block electrodes and to make contact holes reaching said upper electrode layer of said edge emission type EL devices;

forming a conductive layer covering said contact holes; and etching said conductive layer to form a plurality of common electrodes conducting to predetermined edge emission type EL devices of each block.

3. A method for manufacturing edge emission type electroluminescent (EL) device arrays, said method comprising the steps of:

forming a first conductive layer on a substrate;

forming a second conductive layer on the first conductive layer;

etching said second conductive layer to produce a plurality of block electrodes each conductive to a predetermined number of edge emission type EL devices;

depositing an EL device layer and an upper electrode layer onto said block electrodes;

patterning said EL device layer and upper electrode layer into a plurality of distinctly divided edge emission type EL devices;

providing a transparent protective film over the entire surface of said substrate containing said edge emission type EL devices;

etching said protective film to form terminals through exposure of the edges of said block electrodes and to make contact holes reaching said upper electrode layer of said edge emission type EL devices;

forming a third conductive layer covering said contact holes; and etching said third conductive layer to form a plurality of common electrodes conducting to predetermined edge emission type EL devices of each block.

4. The method according to claim 3, wherein the first conductive layer comprises Cr and the second conductive layer comprises Ti.

5. The method according to claim 3, wherein the EL device layer comprises a first dielectric sub-layer, an active sub-layer formed on the first dielectric sublayer, and a second dielectric sub-layer formed on the active sub-layer.

6. The method according to claim 5, wherein the first and second dielectric layers comprise $Y_2O_3$ and the active layer comprises ZnS.

7. A method for manufacturing edge emission type electroluminescent (EL) device arrays, said method comprising the steps of:

forming a first conductive layer on a substrate;

forming a second conductive layer on the first conductive layer;

etching said second conductive layer to produce a plurality of block electrodes each conductive to a predetermined number of edge emission type EL devices;

depositing an EL device layer and an upper electrode layer onto said block electrodes;

patterning said EL device layer and upper electrode layer into a plurality of distinctly divided edge emission type EL devices;

providing a transparent protective film over the entire surface of said substrate containing said edge emission type EL device;

providing a photosensitive polyimide resin film onto the entire surface of said transparent protective film;

etching said polyimide resin film to expose light-emitting edges of said edge emission type EL devices and to make pre-holes reaching said transparent protective film;

thermally curing said polyimide film to produce an insulating layer;

etching said protective film through the pre-holes to form terminals through exposure of the edges of said block electrodes and to make contact holes reaching said upper electrode layer of said edge emission type EL devices;

forming a third conductive layer covering said contact holes; and etching said third conductive layer to form a plurality of common electrodes conducting to predetermined edge emission type EL devices of each block.

* * * * *